US009158202B2

(12) United States Patent
Peters et al.

(10) Patent No.: US 9,158,202 B2
(45) Date of Patent: Oct. 13, 2015

(54) PROCESS AND COMPOSITION FOR REMOVING SUBSTANCES FROM SUBSTRATES

(71) Applicant: Dynaloy, LLC, Kingsport, TN (US)

(72) Inventors: Richard Dalton Peters, Kingsport, TN (US); Travis Acra, Ingalls, IN (US); Yuanmei Cao, Indianapolis, IN (US); Spencer Erich Hochstetler, Kingsport, TN (US); Michael Tod Phenis, Markleville, IN (US); Kimberly Dona Pollard, Anderson, IN (US)

(73) Assignee: Dynaloy, LLC, Kingsport, TN (US)

( * ) Notice: Subject to any disclaimer, the term of this patent is extended or adjusted under 35 U.S.C. 154(b) by 85 days.

(21) Appl. No.: 13/834,513

(22) Filed: Mar. 15, 2013

(65) Prior Publication Data

US 2014/0142017 A1    May 22, 2014

Related U.S. Application Data

(60) Provisional application No. 61/728,905, filed on Nov. 21, 2012.

(51) Int. Cl.
    *G03F 7/42*    (2006.01)
    *C11D 7/32*    (2006.01)
    *C11D 11/00*   (2006.01)

(52) U.S. Cl.
    CPC .............. *G03F 7/422* (2013.01); *C11D 7/3218* (2013.01); *C11D 7/3263* (2013.01); *C11D 7/3281* (2013.01); *C11D 11/0047* (2013.01); *G03F 7/425* (2013.01)

(58) Field of Classification Search
    CPC .................................................... C11D 11/0047
    USPC .................................. 510/175, 176; 134/1.3
    See application file for complete search history.

(56) References Cited

U.S. PATENT DOCUMENTS

| | | | |
|---|---|---|---|
| 3,873,668 A | 3/1975 | Melby | |
| 3,888,891 A | 6/1975 | Smith et al. | |
| 3,920,695 A | 11/1975 | Smith et al. | |
| 3,963,744 A | 6/1976 | Smith et al. | |
| 3,981,859 A | 9/1976 | Smith et al. | |
| 4,038,293 A | 7/1977 | Smith et al. | |
| 4,518,675 A | 5/1985 | Kataoka | |
| 4,547,271 A | 10/1985 | Bharucha et al. | |
| 4,830,641 A | 5/1989 | White, Jr. et al. | |
| 4,904,571 A | 2/1990 | Miyashita et al. | |
| 5,008,273 A | 4/1991 | Schnorrenberg et al. | |
| 5,233,010 A | 8/1993 | McGhee et al. | |
| 5,252,737 A | 10/1993 | Stern et al. | |
| 5,369,189 A | 11/1994 | Kim et al. | |
| 5,422,309 A | 6/1995 | Zettler et al. | |
| 5,453,541 A | 9/1995 | Stern et al. | |
| 5,567,574 A | 10/1996 | Hasemi et al. | |
| 5,597,678 A | 1/1997 | Honda et al. | |
| 5,608,111 A | 3/1997 | Stern et al. | |
| 5,612,304 A | 3/1997 | Honda et al. | |
| 5,623,088 A | 4/1997 | Stern et al. | |
| 5,648,324 A | 7/1997 | Honda et al. | |
| 5,795,702 A | 8/1998 | Tanabe et al. | |
| 5,798,323 A | 8/1998 | Honda et al. | |
| 6,033,996 A | 3/2000 | Rath et al. | |
| 6,063,522 A | 5/2000 | Hamrock et al. | |
| 6,137,010 A | 10/2000 | Joo et al. | |
| 6,200,891 B1 | 3/2001 | Jagannathan et al. | |
| 6,225,030 B1 | 5/2001 | Tanabe et al. | |
| 6,310,020 B1 | 10/2001 | Shirota et al. | |
| 6,319,835 B1 | 11/2001 | Sahbari et al. | |
| 6,372,410 B1 | 4/2002 | Ikemoto et al. | |
| 6,399,273 B1 | 6/2002 | Yamada et al. | |
| 6,455,479 B1 | 9/2002 | Sahbari | |
| 6,465,403 B1 | 10/2002 | Skee | |
| 6,531,436 B1 | 3/2003 | Sahbari et al. | |
| 6,566,322 B1 | 5/2003 | Brook et al. | |
| 6,579,688 B2 | 6/2003 | Steaffens et al. | |
| 6,585,825 B1 * | 7/2003 | Skee ................................ | 134/3 |
| 6,638,694 B2 | 10/2003 | Ikemoto et al. | |
| 6,683,219 B2 | 1/2004 | DeLuca et al. | |
| 6,777,380 B2 | 8/2004 | Small et al. | |

(Continued)

FOREIGN PATENT DOCUMENTS

| | | |
|---|---|---|
| CN | 101 907 835 A | 12/2010 |
| EP | 0678571 | 10/1995 |

(Continued)

OTHER PUBLICATIONS

USPTO Non-Final Office Action dated Nov. 18, 2013 received in U.S. Appl. No. 12/637,828.

(Continued)

*Primary Examiner* — Gregory Webb
(74) *Attorney, Agent, or Firm* — Dennis V. Carmen; Matthew W. Smith

(57) ABSTRACT

Compositions are described that are useful for removing organic and organometallic substances from substrates, for example, photoresist wafers. Processes are presented that apply a minimum volume of a composition as a coating to the inorganic substrate whereby sufficient heat is added and the organic or organometallic substances are completely removed by rinsing. The compositions and processes may be suitable for removing and, in some instances, completely dissolving photoresists of the positive and negative varieties, and specifically negative dry film photoresist from electronic devices.

28 Claims, No Drawings

(56) References Cited

U.S. PATENT DOCUMENTS

| | | |
|---|---|---|
| 6,825,156 B2 | 11/2004 | Lee et al. |
| 6,844,461 B2 | 1/2005 | DeLuca et al. |
| 6,846,748 B2 | 1/2005 | Chien et al. |
| 6,872,633 B2 | 3/2005 | Huang et al. |
| 6,878,500 B2 | 4/2005 | Rutter, Jr. et al. |
| 6,916,772 B2 | 7/2005 | Zhou et al. |
| 7,049,275 B2 | 5/2006 | Ikemoto et al. |
| 7,078,371 B2 | 7/2006 | Ikemoto |
| 7,144,848 B2 | 12/2006 | Zhou et al. |
| 7,157,605 B2 | 1/2007 | Kim et al. |
| 7,166,362 B2 | 1/2007 | Kano |
| 7,528,098 B2 | 5/2009 | Lee et al. |
| 7,543,592 B2 | 6/2009 | Lee |
| 7,579,308 B2 | 8/2009 | Lee |
| 7,615,377 B2 | 11/2009 | Lippard et al. |
| 7,632,796 B2 | 12/2009 | Phenis et al. |
| 7,700,533 B2 | 4/2010 | Egbe et al. |
| 7,960,328 B2 | 6/2011 | Visintin et al. |
| 8,263,539 B2 | 9/2012 | Phenis et al. |
| 8,440,389 B2 | 5/2013 | Pollard et al. |
| 8,697,345 B2* | 4/2014 | Wakiya et al. .............. 430/329 |
| 8,987,181 B2 | 3/2015 | Pollard et al. |
| 2001/0014534 A1 | 8/2001 | Aoki et al. |
| 2002/0037819 A1 | 3/2002 | Sahbari |
| 2002/0037820 A1 | 3/2002 | Small et al. |
| 2002/0128164 A1 | 9/2002 | Hara et al. |
| 2003/0114014 A1 | 6/2003 | Yokoi et al. |
| 2003/0130149 A1 | 7/2003 | Zhou et al. |
| 2003/0138737 A1 | 7/2003 | Wakiya et al. |
| 2003/0181344 A1 | 9/2003 | Ikemoto et al. |
| 2003/0186175 A1 | 10/2003 | Ikemoto et al. |
| 2003/0228990 A1 | 12/2003 | Lee et al. |
| 2004/0038840 A1 | 2/2004 | Lee et al. |
| 2004/0048761 A1 | 3/2004 | Ikemoto |
| 2004/0081922 A1 | 4/2004 | Ikemoto et al. |
| 2004/0106532 A1 | 6/2004 | Yokoi et al. |
| 2004/0147420 A1 | 7/2004 | Zhou et al. |
| 2004/0147421 A1 | 7/2004 | Charm et al. |
| 2004/0220066 A1 | 11/2004 | Rutter, Jr. |
| 2004/0256358 A1 | 12/2004 | Shimizu et al. |
| 2004/0266912 A1 | 12/2004 | Aida et al. |
| 2005/0014667 A1* | 1/2005 | Aoyama et al. .............. 510/175 |
| 2005/0074556 A1 | 4/2005 | Kano |
| 2005/0084792 A1 | 4/2005 | Yokoi et al. |
| 2005/0090416 A1 | 4/2005 | Lee et al. |
| 2005/0112769 A1 | 5/2005 | Lippard et al. |
| 2005/0143365 A1 | 6/2005 | Kim et al. |
| 2005/0176259 A1 | 8/2005 | Yokoi et al. |
| 2005/0263743 A1* | 12/2005 | Lee ............................. 252/364 |
| 2006/0003910 A1 | 1/2006 | Hsu et al. |
| 2006/0046446 A1 | 3/2006 | Kon et al. |
| 2006/0094613 A1 | 5/2006 | Lee |
| 2006/0138399 A1 | 6/2006 | Itano et al. |
| 2006/0199749 A1* | 9/2006 | Suzuki et al. .............. 510/175 |
| 2007/0037087 A1 | 2/2007 | Yokoi et al. |
| 2007/0066502 A1* | 3/2007 | Brainard et al. .............. 510/175 |
| 2007/0149430 A1 | 6/2007 | Egbe et al. |
| 2007/0243773 A1 | 10/2007 | Phenis et al. |
| 2008/0070404 A1 | 3/2008 | Beck et al. |
| 2008/0076688 A1 | 3/2008 | Barnes et al. |
| 2008/0139436 A1* | 6/2008 | Reid .............................. 510/176 |
| 2009/0047609 A1 | 2/2009 | Atkinson et al. |
| 2009/0119979 A1 | 5/2009 | Mullen |
| 2009/0186793 A1 | 7/2009 | Phenis et al. |
| 2010/0056409 A1 | 3/2010 | Walker et al. |
| 2010/0089426 A1* | 4/2010 | Phenis et al. .................... 134/34 |
| 2010/0112728 A1 | 5/2010 | Korzenski et al. |
| 2010/0152086 A1* | 6/2010 | Wu et al. ....................... 510/175 |
| 2010/0221503 A1* | 9/2010 | Pollard et al. .............. 428/195.1 |
| 2010/0242998 A1* | 9/2010 | Quillen et al. .................. 134/19 |
| 2010/0249181 A1 | 9/2010 | DeGoey et al. |
| 2010/0298605 A1 | 11/2010 | Hirose et al. |
| 2011/0212866 A1 | 9/2011 | Rao et al. |
| 2011/0311921 A1* | 12/2011 | Egbe et al. .................... 430/323 |
| 2013/0143785 A1 | 6/2013 | Taniguchi et al. |
| 2013/0161840 A1 | 6/2013 | Pollard et al. |
| 2013/0172225 A1 | 7/2013 | Phenis et al. |

FOREIGN PATENT DOCUMENTS

| | | |
|---|---|---|
| EP | 1 128 221 A2 | 8/2001 |
| EP | 1211563 A1 | 6/2002 |
| EP | 1562225 | 8/2005 |
| EP | 1 619 557 A1 | 1/2006 |
| EP | 1736534 | 12/2006 |
| JP | 62188785 A | 8/1987 |
| JP | 07-28254 | 1/1995 |
| JP | 2001-244258 A | 9/2001 |
| JP | 2001312074 A | 11/2001 |
| JP | 2003-255565 A | 9/2003 |
| JP | 2004-093678 A | 3/2004 |
| JP | 2004-133153 A | 4/2004 |
| TW | 526397 B | 4/2003 |
| WO | WO 99/19447 A1 | 4/1999 |
| WO | WO 02/04233 | 1/2002 |
| WO | WO 03/006597 A1 | 1/2003 |
| WO | WO 03/006598 A1 | 1/2003 |
| WO | WO 03/007085 A1 | 1/2003 |
| WO | WO 03/083920 A1 | 10/2003 |
| WO | WO 2007/053363 A2 | 5/2007 |
| WO | WO 2009/051237 A1 | 4/2009 |
| WO | WO 2011/012559 A2 | 2/2011 |
| WO | WO 2011/025180 A2 | 3/2011 |
| WO | WO 2014/081464 A1 | 5/2014 |

OTHER PUBLICATIONS

USPTO Non-Final Office Action dated Jun. 26, 2013 received in U.S. Appl. No. 12/637,828.
USPTO Non-Final Office Action dated Jul. 19, 2011 received in U.S. Appl. No. 12/637,828.
USPTO Final Office Action dated Apr. 30, 2014 received in U.S. Appl. No. 12/637,828.
USPTO Notice of Allowance dated Oct. 11, 2013 received in U.S. Appl. No. 12/637,828.
USPTO Notice of Allowance dated Apr. 8, 2013 received in U.S. Appl. No. 12/637,828.
USPTO Notice of Allowance dated Nov. 17, 2011 received in U.S. Appl. No. 12/637,828.
USPTO Non-Final Office Action dated Nov. 6, 2013 received in U.S. Appl. No. 13/759,237.
USPTO Non-Final Office Action dated Feb. 6, 2014 received in U.S. Appl. No. 13/759,237.
USPTO Final Office Action dated May 13, 2014 received in U.S. Appl. No. 13/759,237.
Co-pending U.S. Appl. No. 14/174,261, filed on Feb. 6, 2014; Michael T. Phenis.
USPTO Non-Final Office Action dated Jul. 22, 2013 received in U.S. Appl. No. 13/769,583.
USPTO Final Office Action dated Feb. 7, 2014 received in U.S. Appl. No. 13/769,583.
Co-pending U.S. Appl. No. 14/174,246, filed on Feb. 6, 2014; Richard Dalton Peters.
European Search Report for Application EP 13 00 3730 dated Sep. 9, 2013.
European Search Report for Application EP 13 00 3729 dated Aug. 21, 2013.
Ho et al., Wafer-Scale, Sub-5 nm Junction Formation by Monolayer Doping and Conventional Spike Annealing, Nano Letters, 2009, vol. 9, No. 2, pp. 725-730, entire document, especially: p. 726, col. 1, para. 2.
Ho et al., Controlled Nanoscale Doping of Semiconductors via Molecular Monolayers, Nature Materials, vol. 7, Jan. 2008, pp. 62-67, entire document.
"Resorcinol CAS# 108-46-3", IS Chemical Technology, 2010.
Notification of Transmittal of the International Search Report dated Feb. 21, 2008 for corresponding PCT/US2007/066128.
Written opinion of the International Searching Authority dated Feb. 21, 2008 for corresponding PCT/US2007/066128.

(56) References Cited

OTHER PUBLICATIONS

Notification of Transmittal of the International Search Report dated Jun. 5, 2008 for corresponding PCT/US2006/041394.
Written opinion of the International Searching Authority dated Nov. 25, 2009 for corresponding PCT/US2009/048409.
Notification of Transmittal of the International Search Report dated Nov. 25, 2009 for corresponding PCT/US2009/048409.
Co-pending U.S. Appl. No. 13/759,237, filed Feb. 5, 2013; Michael Phenis.
Co-pending U.S. Appl. No. 13/769,853, filed Feb. 19, 2013; Kimberly Dona Pollard.
USPTO Non-Final Office Action dated Oct. 9, 2014 received in U.S. Appl. No. 13/769,853.
USPTO Office Action dated Feb. 26, 2015 received in U.S. Appl. No. 13/769,853.
USPTO Office Action dated Mar. 10, 2015 received in U.S. Appl. No. 14/174,246.
USPTO Notice of Allowance dated Mar. 17, 2015 received in U.S. Appl. No. 13/759,237.
USPTO Office Action dated Mar. 20, 2015 received in U.S. Appl. No. 12/637,828.
USPTO Notice of Allowance dated Apr. 30, 2015 received in U.S. Appl. No. 13/759,237.
USPTO Office Action dated Jun. 22, 2015 received in U.S. Appl. No. 14/174,261.
Notification of Transmittal of the International Search Report dated Jun. 24, 2015 received in International Patent Application No. PCT/US2015/011692.

* cited by examiner

PROCESS AND COMPOSITION FOR REMOVING SUBSTANCES FROM SUBSTRATES

CROSS REFERENCE TO RELATED PATENT APPLICATIONS

This application claims priority to U.S. Provisional Patent Application No. 61/728,905, filed on Nov. 21, 2012, entitled "Process and Composition for Removing Substances from Substrates," which is hereby incorporated by reference in its entirety.

STATEMENT OF JOINT DEVELOPMENT

This invention was created pursuant to a joint development agreement between Eastman Chemical Co. and EV Group. The aforementioned joint development agreement was in effect on or before the date the claimed invention was made, and the claimed invention was made as a result of activities undertaken within the scope of the joint development agreement.

BACKGROUND

Various polymers may be used in the manufacture of electronic devices, including, for instance, photoresists and organic-based dielectrics. Photoresists, for example, may be used throughout semiconductor device fabrication in photolithographic operations. A photoresist may be exposed to actinic radiation through a photomask. Where a positive-acting resist is used, exposure may cause a chemical reaction within the material resulting in a solubility increase in aqueous alkali, allowing it to be dissolved and rinsed away with developer. Where a negative-acting resist is used, cross-linking of the polymer may occur in the exposed regions while leaving unexposed regions unchanged. The unexposed regions may be subject to dissolution and rinsing by a suitable developer chemistry. Following development, a resist mask may be left behind. The design and geometry of the resist mask may depend upon the positive or negative tone of the resist; positive tone resist may match the design of the photomask, while a negative tone resist may provide a pattern that is opposite the photomask design.

Photoresists are used extensively in many applications, including the packaging of microelectronic devices and in manufacturing compound semiconductors.

In wafer level packaging, solder is applied directly to wafers that have completed the fabrication of the microelectronic devices but have not been diced into individual chips. Photoresist is used as the mask to define the placement of the solder on the wafers. After solder is deposited onto the wafer, the photoresist must be removed before the next step in the packaging process can occur. Typically in wafer level packaging, the photoresist is very thick, greater than 10 µm and sometimes as thick as 120 µm. The photoresist can be positive or negative, and can be applied either as a liquid or a dry film. In wafer level packaging, the use of thick dry film negative photoresist is common.

Due to the thickness and cross-linked nature of thick dry film negative photoresist, the removal of this material after solder deposition can be difficult. As a result of requirements for these process flows, immersion cleaning developed so that multiple wafers, typically 25 to 50 at a time, could be processed simultaneously and increase the tool throughput while still accommodating the long process time. The success with this type of processing allowed thick negative films to be successfully incorporated throughout the packaging process. However as wafer feature dimensions continue to be scaled down and the number of processes per wafer increases, the value of the wafer continues to increase. There comes a point when the best way to minimize risk of a bad result due to a process failure, is to process each wafer individually. Current immersion technology does not offer a removal solution with good cleaning characteristics, good compatibility and a process time that would meet practical throughput and cost-of-ownership targets of the industry.

In compound semiconductor processing, positive and negative spin on photoresist are commonly used. For example, for a lift off process, photoresist is applied and patterned, metal is deposited over the top of the pattern and the photoresist is removed, simultaneously removing metal on top of it. Moreover better stripping compositions that are compatible with the permanent wafer materials are needed for removal of the photoresist in a single wafer process.

Additionally, in compound semiconductor processing, patterns are formed in a layer on the substrate surface by patterning a photoresist on the surface and putting the substrate, with the patterned resist into a chamber with a plasma. The plasma can be selected to preferentially etch the open surface relative to the photoresist, thus creating the same pattern as the photoresist in the exposed layer. After the plasma treatment, photoresist as well as post etch residue, often organometallic and/or metal organic in nature, remains on the surface. Removal of the post etch residue at the same time as the remaining photoresist, while still maintaining compatibility with the permanent materials on the wafer surface would help ensure device performance.

SUMMARY

This summary is provided to introduce simplified concepts of compositions for removing substances from substrates such as, for example, photoresist from a semiconductor wafer. Additional details of example compositions are further described below in the Detailed Description. This summary is not intended to identify essential features of the claimed subject matter, nor is it intended for use in determining the scope of the claimed subject matter.

According to an embodiment, the present disclosure concerns a composition for removing substances from substrates. The composition may include from about 20 wt. % to about 90 wt. % of a polar aprotic solvent other than dimethyl sulfoxide; from about 1 wt. % to about 70 wt. % of at least one alkanolamine; less than about 3 wt. % a quaternary ammonium hydroxide; and a balance in water.

According to another embodiment, the present disclosure concerns a composition for removing a substances from substrates which may include from about 20 wt % to about 90 wt. % of a polar aprotic solvent; from about 10 wt % to about 70 wt. % of a first alkanolamine; from about 10 wt % to about 70 wt. % of a second alkanolamine; and a balance in water.

According to yet another embodiment, the present disclosure concerns a composition for removing substances from substrates which may include from about 20 wt. % to about 90 wt. % of a polar aprotic solvent; from about 1 wt. % to about 70 wt % of an amine or alkanolamine, and from about 1 ppm to about 10 wt % of a corrosion inhibitor.

DETAILED DESCRIPTION

The current invention describes compositions useful for removing organic substances (such as photoresists), from inorganic substrates, such as, for example, semiconductor wafers. The stripping compositions overcome disadvantages with current cleaning technologies and enable the successful removal of thick dry film negative photoresist from wafers.

The stripping solutions of the present disclosure may have application in the manufacture of a variety of devices including but not limited to semiconductor wafers, RF devices, hard drives, memory devices, MEMS, photovoltaics, Displays, LEDs, wafer level packaging, solder bump fabrication and memory resistor fabrication. Other applications in which the stripping solutions as disclosed may also be useful, include without limitation removal of photoresists (BEOL, FEOL), post-metallization, post etch residues, post implantation residues, lift-off (controlled corrosion), rework of passivation layers, and photoresist rework.

The terms "stripping", "removing", and "cleaning" are used interchangeably throughout this specification. Likewise, the terms "stripping composition", "stripping solution", and "cleaning composition" are used interchangeably. The indefinite articles "a" and "an" are intended to include both the singular and the plural. All ranges are inclusive and combinable in any order except where it is clear that such numerical ranges are constrained to add up to 100%, and each range includes all the integers within the range. The terms "weight percent" or "wt %" mean weight percent based on the total weight of the composition, unless otherwise indicated.

According to an embodiment, the present invention concerns a stripping solution comprising a polar aprotic solvent other than dimethyl sulfoxide, an amine or alkanolamine, and a quaternary ammonium hydroxide. Moreover, the balance of the stripping solution can be water. Additives may also be included such as metal corrosion inhibitors, or surfactants. Some stripping compositions additionally contain a secondary solvent.

The polar aprotic solvent is a polar aprotic solvent other than dimethyl sulfoxide and can be, but is not limited to, dimethylformamide; dimethylacetamide; 1-formylpiperidine; dimethylsulfone; n-methylpyrrolidone, n-cyclohexyl-2-pyrrolidone or mixtures thereof. According to an embodiment, the polar aprotic solvent is present in the stripping composition at an amount of from about 20 wt. % to about 90 wt. %; from about 35 wt. % to about 85 wt. % or from about 55 wt. % to about 80 wt. %. According to other embodiments, the polar aprotic solvent is present in an amount of at least 20 wt %, at least 30 wt. %, at least 40 wt. %, at least 50 wt. %, at least 60 wt. %, at least 70 wt. % or at least 80 wt. %. According to other embodiments, the polar aprotic solvent is present in an amount of no greater than 90 wt %, no greater than 80 wt. %, no greater than 70 wt. %, no greater than 60 wt. %, no greater than 50 wt. %, no greater than 40 wt. %, no greater than 30 wt. % or no greater than 20 wt. %.

According to an embodiment, the alkanolamines can have at least two carbon atoms, at least one amino substituent and at least one hydroxyl substituent, wherein the amino and hydroxyl substituents are attached to two different carbon atoms. According to an embodiment, the alkanolamine is present in the stripping composition at an amount of from about 1 wt. % to about 70 wt. %; from about 15 wt. % to about 60 wt. % or from about 25 wt. % to about 55 wt. %. According to other embodiments, the alkanolamine is present in an amount of less than 20 wt. %, or less than 10 wt. % or less than 5 wt. %. According to other embodiments, the alkanolamine is present in an amount of at least 1.0 wt %, at least 5 wt. %, at least 10 wt. %, at least 20 wt. %, at least 30 wt. %, at least 40 wt. %, at least 50 wt. % or at least 60 wt. %. According to other embodiments, the alkanolamine is present in an amount of no greater than 70 wt. %, no greater than 60 wt. %, no greater than 50 wt. %, no greater than 40 wt. %, no greater than 30 wt. %, no greater than 20 wt. %, no greater than 10 wt. % or no greater than 5 wt. %.

According to an embodiment, the compositions contain 1,2-alkanolamines having the formula:

where $R^1$ is hydrogen, $(C_1-C_4)$ alkyl, or $(C_1-C_4)$ alkylamino.

According to an embodiment, alkanolamines have at least two carbon atoms and have the amino and hydroxyl substituents on different carbon atoms. Suitable alkanolamines include, but are not limited to, aminoethylethanolamine, dimethylaminoethanol, monoethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol and mixtures thereof.

According to another embodiment, amines include diethylenetriamine, triethylenetetramine, tetraethylenepentamine, dimethylbenzylamine, malonamide and mixtures thereof.

According to an embodiment, the quaternary ammonium hydroxide includes $(C_1-C_8)$ alkyl, benzyl and mixtures thereof. According to an embodiment, the quaternary ammonium hydroxide can be but is not limited to tetramethylammonium hydroxide; tetramethylammonium hydroxide pentahydrate; tetrabutylammonium hydroxide; benzyltrimethylammonium hydroxide; tetrapropylammonium; dimethyldipropyl-ammonium hydroxide; tetraethyl ammonium hydroxide; dimethyldiethyl ammonium hydroxide or mixtures thereof. According to embodiment, the quaternary ammonium hydroxide is present in the stripping composition at an amount of less than about 3.5 wt. %, less than about 2.5 wt. %, or less than about 2.0 wt. %.

Because some of the stripping solution's components can be provided as aqueous solutions, the composition can optionally contain small amounts of water. Hence, according to an embodiment, the balance of the stripping composition can be water. Moreover, water can be present in the stripping composition at an amount of less than about 15 wt. %, less than about 10 wt. %, or less than about 5 wt. %.

According to an embodiment, the compositions may contain about 20 wt. % to about 90 wt. % polar aprotic solvent, from about 10 wt. % to about 70 wt. % of the alkanolamine, less than about 3 wt % of the quaternary ammonium hydroxide and the balance in water.

According to an embodiment, the stripping compositions can also include a secondary solvent, a surfactant, and/or a corrosive inhibitor. Moreover, when used, a secondary solvent typically comprises from about 2 wt. % to about 35 wt. % of the composition. Secondary solvents may include but are not limited to ethylene glycol, diethylene glycol, propylene glycol, dipropyleneglycol, isopropylene glycol, diisopropylene glycol, butylene glycol, dibutylene glycol, ethylene glycol monomethyl ether, ethylene glycol monoethyl ether, ethylene glycol monopropylether, ethylene glycol monobutyl ether, ethylene glycol dimethyl ether, ethylene glycol diethyl ether, ethylene glycol dipropyl ether, ethylene glycol dibutyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol diethyl ether, triethylene glycol monomethyl ether, triethylene glycol dimethyl ether, polyethylene glycol monomethyl ether, diethylene glycol methyl ethyl ether, triethylene glycol, ethylene glycol monomethyl ether acetate, ethylene glycol monoethyl acetate, propylene glycol monomethyl ether, propylene glycol dimethyl ether, propylene glycol monobutyl ether, dipropyelene glycol monomethyl ether, dipropylene glycol monopropyl ether, dipropylene glycol monoisopropyl ether, dipropylene glycol monobutyl ether, dipropylene glycol dimethyl ether, dipropylene glycol dipropyl ether, dipropylene glycol diisopropyl ether, tripropylene glycol and tripropylene glycol monomethyl ether, 1-methoxy-2-butanol, 2-methoxy-1-butanol, 2-methoxy-2-methyl-2-butanol, dioxane, trioxane, 1,1-dimethoxyethane, tetrahydrofuran, crown ethers and the like.

The stripping compositions can also contain an optional surfactant, for example, at levels in the range of about 0.01% to about 3%. One example of a fluorosurfactant is DuPont FSO (fluorinated telomere B monoether with polyethylene glycol (50%), ethylene glycol (25%), 1,4-dioxane (<0.1%), water 25%). Other useful surfactants include but are not limited to, Glycol Palmitate, Polysorbate 80, Polysorbate 60, Polysorbate 20, Sodium Lauryl Sulfate, Coco Glucoside, Lauryl-7 Sulfate, Sodium Lauryl Glucose Carboxylate, Lauryl Glucoside, Disodium Cocoyl Glutamate, Laureth-7 Citrate, Disodium Cocoamphodiacetate, nonionic Gemini surfactants including, for example, those sold under the tradename ENVIROGEM 360, nonionic fluorosurfactants including, for example, those sold under the tradename ZONYL FSO, ionic fluorinated surfactants including, for example, those sold under the tradename CAPSTONE FS-10, Oxirane polymer surfactants including, for example, those sold under the tradename SURFYNOL 2502, and poloxamine surfactants, including, for example, those sold under the tradename TETRONIC 701 and mixtures thereof.

The compositions can also optionally contain one or more corrosion inhibitors. A single corrosion inhibitor may be used or a combination of corrosion inhibitors may be used. Corrosion inhibitors may be included at levels ranging from about 1 ppm to about 10%.

Suitable corrosion inhibitors include, but are not limited to, dodecanedioic acid, undecanedioic acid, silicates such as ethyl silicate and tetramethyl ammonium silicate; aromatic hydroxyl compounds such as catechol and resorcinol; alkylcatechols such as methylcatechol, ethylcatechol and t-butylcatechol, phenols and pyrogallol; aromatic triazoles such as benzotriazole; alkylbenzotriazoles; carboxylic acids such as formic acid, acetic acid, propionic acid, butyric acid, isobutyric acid, oxalic acid, malonic acid, succinic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; organic salts of carboxyl containing organic containing compounds described above, basic substances such as ethanolamine, trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime.

According to certain embodiments, the corrosive inhibitor includes a mixture of dodecanedioic acid, undecanedioic acid, and sebacic acid.

According to certain embodiments the stripping compositions display high loading capacities enabling the composition to remove higher levels of photoresists without the precipitation of solids. The loading capacity is defined as the number of $cm^3$ of photoresist or bilayer material that can be removed for each liter of stripping solution before material is re-deposited on the wafer or before residue remains on the wafer. For example, if 20 liters of a stripping solution can remove 300 $cm^3$ of photoresist before either redeposition occurs or residue remains on the wafer, the loading capacity is 300 $cm^3$/20 liters=15 $cm^3$/liter.

According to another embodiment, the stripping solution comprises a polar aprotic solvent; a first alkanolamine and a second alkanolamine. In another embodiment, the stripping solution includes a polar aprotic solvent; and at least two alkanolamines. Moreover, according to this embodiment, the polar aprotic solvent can be but is not limited to dimethyl sulfoxide; dimethylformamide; dimethylacetamide; 1-formylpiperidine; dimethylsulfone; n-methylpyrrolidone, n-cyclohexyl-2-pyrrolidone or mixtures thereof. According to this embodiment, the alkanolamines can be as described above. According to this embodiment, the compositions may contain about 20 wt, % to about 90 wt. % polar aprotic solvent, from about 1 wt. % to about 70 wt. % of a first alkanolamine, and from about 1 wt. % to about 70 wt. % of a second alkanolamine. According to an embodiment, the balance of the stripping solution can be in water. The stripping compositions can also contain secondary solvents, one or more corrosive inhibitors and one or more surfactants as described above.

According to this embodiment, the polar aprotic solvent is present in the stripping composition at an amount of from about 20 wt. % to about 90 wt. %; from about 35 wt. % to about 85 wt. % or from about 55 wt. % to about 80 wt. %. According to other embodiments, the polar aprotic solvent is present in an amount of at least 20 wt %, at least 30 wt. %, at least 40 wt. %, at least 50 wt. %, at least 60 wt. %, at least 70 wt. % or at least 80 wt. %. According to other embodiments, the polar aprotic solvent is present in an amount of no greater than 90 wt %, no greater than 80 wt. %, no greater than 70 wt. %, no greater than 60 wt. %, no greater than 50 wt. %, no greater than 40 wt. %, no greater than 30 wt. % or no greater than 20 wt. %.

According to this embodiment, each of the alkanolamines is present in the stripping composition at an amount of from about 1 wt. % to about 70 wt. %; from about 15 wt. % to about 60 wt. % or from about 25 wt. % to about 55 wt. %. Alternatively, each of the alkanolamines is present in an amount of less than 20 wt. %, or less than 10 wt. % or less than 5 wt. %. Alternatively still, each alkanolamine is present in an amount of at least 1 wt %, at least 5 wt. %, at least 10 wt. %, at least 20 wt. %, at least 30 wt. %, at least 40 wt. %, at least 50 wt. % or at least 60 wt. %.

According to yet another embodiment, the stripping solution comprises a polar aprotic solvent, an amine or alkanolamine, and a corrosion inhibitor. Moreover, according to this embodiment, the polar aprotic solvent can be but is not limited to dimethyl sulfoxide; dimethylformamide; dimethylacetamide; 1-formylpiperidine; dimethylsulfone; n-methylpyrrolidone, n-cyclohexyl-2-pyrrolidone or mixtures thereof. According to this embodiment, the polar aprotic solvent may be present in the stripping composition at an amount of from about 20 wt. % to about 90 wt. %; from about 35 wt. % to about 85 wt. % or from about 55 wt. % to about 80 wt. %. According to other embodiments, the polar aprotic solvent is present in an amount of at least 20 wt %, at least 30 wt. %, at least 40 wt. %, at least 50 wt. %, at least 60 wt. %, at least 70 wt. % or at least 80 wt. %. According to other embodiments, the polar aprotic solvent is present in an amount of no greater than 90 wt %, no greater than 80 wt. %, no greater than 70 wt. %, no greater than 60 wt. %, no greater than 50 wt. %, no greater than 40 wt. %, no greater than 30 wt. % or no greater than 20 wt. %.

According to embodiment, the alkanolamine or amine may be as listed above and may be present in the stripping composition at an amount of from about 1 wt. % to about 70 wt. %; from about 15 wt. % to about 60 wt. % or from about 25 wt. % to about 55 wt. %. According to other embodiments, the alkanolamine is present in an amount of less than 20 wt. %, or less than 10 wt. % or less than 5 wt. %. According to other embodiments, the alkanolamine is present in an amount of at least 1 wt %, at least 5 wt. %, at least 10 wt. %, at least 20 wt. %, at least 30 wt. %, at least 40 wt. %, at least 50 wt. % or at least 60 wt. %. According to other embodiments, the alkanolamine is present in an amount of no greater than 70 wt %, no greater than 60 wt. %, no greater than 50 wt. %, no greater than 40 wt. %, no greater than 30 wt. %, no greater than 20 wt. %, no greater than 10 wt. % or no greater than 5 wt. %.

According to certain embodiments, a single corrosion inhibitor may be used or a combination of corrosion inhibitors may be used. Corrosion inhibitors may be as listed above and may be included at levels ranging from about 1 ppm to about 10 wt. %, from about 100 ppm to about 7 wt %; or from about 500 ppm to about 5 wt. %.

According to certain embodiments, the polar aprotic solvent is 1-formylpiperidine, the alkanolamine is aminoethylethanolamine, and the corrosion inhibitor is a mixture of dodecanedioic acid, undecanedioic acid, and sebacic acid.

According to certain embodiments, the stripping solution comprises a polar aprotic solvent, such as for example, 1-formylpiperidine, an amine or alkanolamine, such as, for example, aminoethylethanolamine, and a corrosion inhibitor, such as, for example, a mixture of dodecanedioic acid, undecanedioic acid, and sebacic acid.

The stripping solutions according to the present invention can be used to remove photoresist from a number of different substrates and via a number of different methods including methods that involve immersing the substrate or via single wafer cleaning processes that coat a surface of the substrates (e.g. coat the surface of the substrate upon which the photoresist is located) one at a time. When immersing a substrate, agitation of the composition additionally facilitates photoresist removal. Agitation can be effected by mechanical stirring, circulating, or by bubbling an inert gas through the composition. Upon removal of the desired amount of photoresist, the substrate is removed from contact with the stripping solution and rinsed with water or an alcohol. For substrates having components subject to oxidation, rinsing is preferably done under an inert atmosphere. According to certain embodiments the stripping solutions accordingly have improved loading capacities for photoresist materials compared to current commercial products and are able to process a larger number of substrates with a given volume of stripping solution.

The stripping solutions provided in this disclosure can be used to remove polymeric resist materials present in a single layer or certain types of bilayer resists. For example, bilayer resists typically have either a first inorganic layer covered by a second polymeric layer or can have two polymeric layers. Utilizing the methods taught below, a single layer of polymeric resist can be effectively removed from a standard wafer having a single polymer layer. The same methods can also be used to remove a single polymer layer from a wafer having a bilayer composed of a first inorganic layer and a second or outer polymer layer. Finally, two polymer layers can be effectively removed from a wafer having a bilayer composed of two polymeric layers. The new dry stripping solutions can be used to remove one, two or more resist layers.

According to certain embodiments, the formulations according to the present invention can be employed in cleaning methods as described as follows. An exemplary method includes, but is not limited to the following. First a wafer with a thick dry film negative photoresist is coated with a volume of a formulated solvent-based mixture, where the thickness of the coating is sufficiently thick to enable removal of the thick dry film negative photoresist. The photoresist film is patterned with holes, inside which solder has been plated. The solder may be an alloy of Pb and Sn, Sn and Ag, or Cu pillars with a solder cap. The volume of formulation is such that the thickness of the liquid coating on top of the wafer is less than 4 mm thick, or may be less than 3.5 mm thick, or less than 3 mm thick, or less than 2.5 mm thick, or less than 2 mm thick. Alternatively, the thickness of the formulation is greater than 0.5 mm, greater than 1 mm, or greater than 1.5 mm. The thickness of the liquid coating may be thinner or thicker depending on the application and the resist or residue to be removed. In an embodiment, the thickness of the formulation that is sufficient for removing the photoresist can be defined by the ratio of the thickness of the formulation to the thickness of the photoresist film that is being removed. For thick photoresist, this ratio may be greater than 6:1, or greater than 8:1, or greater than 9:1 or greater than 10:1, or greater than 15:1, or greater than 19:1, or greater than 25:1. In certain embodiments, depending on the application and the resist or residue to be removed, the ratio may be even greater.

According to certain embodiments, the wafer may be held by a chuck that can rotate. The chuck may be such that the backside of the wafer is in contact almost completely with the same material, for example air, or an insulating polymer such as PEEK or PTFE. After the wafer is coated with the formulation, the formulation may be heated. Heating may occur by multiple methods, including convective heating by placement of a heat source within close proximity of the liquid surface, by irradiation with infrared radiation, by conductive heating either by contact to the backside of the wafer or contact directly to the liquid surface by a heat source. The formulation is heated to a temperature that allows for complete removal of the photoresist film within a sufficiently short amount of time. For example, the liquid may be heated to a temperature above 100° C., or above 105° C., or above 110° C., or above 115° C., or above 120° C. A sufficiently short amount of time may be less than 10 min for applying heat to the liquid, or less than 8 min, or less than 6 min, or less than 5 min, or less than 4 min, or less than 3 min, or less than 2 min. Again, the heating temperature and time may be longer or shorter depending on the application and the resist or residue to be removed, After heating for a sufficient amount of time, the heat source is removed. Next, the wafer may be rinsed to remove the formulation, dissolved photoresist in the formulation, and undissolved photoresist particles from the surface of the wafer. Rinsing may comprise multiple steps including dispensing a solvent or solvent-based mixture on the wafer while the wafer is spinning or stationary, dispensing water or an aqueous solution on the wafer while the wafer is spinning or stationary. The order in which these rinsing steps is applied may vary, and rinsing steps may be repeated multiple times. After the wafer is sufficiently rinsed, the wafer may be dried by spin drying. For example, isopropanol may be applied to the wafer prior, during, or after spin drying to facilitate complete drying. This process is used to remove photoresist from a single wafer. The process is repeated for additional wafers, using fresh, unused formulation for every wafer.

EXAMPLES

The stripping compositions according to the embodiments described above are further illustrated by, but not limited to, the following examples wherein all percentages given are by weight unless specified otherwise.

Example 1

This example concerns the removal of a 120 μm thick Asahi CX A240 dry film negative photoresist from a 300 mm wafer with Sn/Ag solder pillars. The composition of the stripping composition was 55 wt % monoethanolamine (MEA), 24.5 wt % n-methylpyrrolidone (NMP), 10 wt % dimethylaminoethanol (DMAE), 10 wt % 1-amino-2-propanol (MIPA), and 0.5 wt % resorcinol. The wafer was processed on an EVG-301 RS single wafer photoresist stripping tool. The wafer was placed in a chuck where ~96% of the surface area of the backside of the wafer was in contact with air, and the outer diameter of the chuck forms a liquid containment barrier around the perimeter of the wafer. The outer 3 mm radius of the backside of the wafer was in contact with the chuck. The wafer was covered with 220 mL of the stripping composition. The inner radius of the chuck is ~4 mm larger than the outer radius of the wafer. The stripping composition fills the total inner diameter of the chuck, i.e., the stripping composition coats the entire top surface of the wafer and extends beyond the total diameter of the wafer to fill the total inner diameter of the chuck. Therefore, the thickness of the stripping composition on top of the wafer was ~2.95 mm. The stripping composition was then heated by bringing a heater heated to 250° C. into close proximity (~1 mm) of the liquid surface. In this manner, the liquid was heated by convective heating. During heating, the temperature was maintained by varying the separation distance between the heater and the liquid surface to control the liquid temperature to a target temperature. In this case, the target temperature for the stripping composition was 105° C. The total time in which heat was applied to the liquid was 9.5 min. After 9.5 min, the heater was removed. Each wafer was then spun to fling off liquid from the surface of the wafer. To perform this fling-off step, the wafer was accelerated to 150 rpm at 200 rpm/sec followed by a delay of 1 sec. After the 1 sec delay, each wafer was rinsed with deionized water via fan spray nozzles while rotating at 500 rpm for 10 sec. The wafer was then rinsed with a small volume of IPA and finally dried by spinning the wafer at 1500 rpm for 20 sec. After this process, the photoresist was removed from the wafer. Results are summarized in Table 1.

TABLE 1

| Example | Formulation Composition (given in wt %) | Heating Time (min) | Resist Removal Results |
|---------|------------------------------------------|---------------------|------------------------|
| 1 | 54.7 wt % MEA, 24.5 wt % NMP, 9.95 wt % DMAE, 9.95 wt % MIPA, 0.5 wt % resorcinol, 0.4 wt % $H_2O$ | 9.5 | Resist was removed |

MEA = monoethanolamine
NMP = n-methylpyrrolidone
DMAE = dimethylaminoethanol
MIPA = 1-amino-2-propanol Example 2

Another formulation was investigated for removing 80 μm thick Asahi CX-8040 dry film negative photoresist from a wafer with Sn/Ag alloy solder. Coupon-sized samples of the wafer were processed on a hot plate. Coupons were placed inside a holder with a well with a volume of 2.7 mL. 1.8 mL of formulation was used to cover the coupon, resulting in a thickness of formulation of ~2 mm on top of the coupon. The holder was placed on the hot plate such that the liquid temperature reached about 108° C. The sample was heated for 3.5 minutes. After heating, the coupon was then removed from the well using tweezers and was rinsed with pressurized water of 45 psi via a fan spray nozzle for 10-20 sec. Finally, the coupon was rinsed with IPA and blown dry with a stream of air. The formulation compositions, heating time, and resist removal results are summarized in the Table 2.

TABLE 2

Formulation composition, heating time, and resist removal result for Example 2.

| Example | Formulation Composition (given in wt %) | Heating Time (min) | Resist Removal Results |
|---------|------------------------------------------|---------------------|------------------------|
| 2 | 77 wt % NMP, 3 wt % MEA, 15.5 wt % propylene glycol, 4 wt % DMDPAH, 0.5 wt % $H_2O$ | 3.5 | Complete resist removal |

DMDPAH = dimethyldipropylammonium hydroxide

Example 3

Another formulation was investigated for its efficacy for removing 120 μm thick Asahi CX A240 dry film negative photoresist from a 300 mm wafer with Sn/Ag solder pillars. Coupon-sized samples of the wafer were processed on a hot plate. Coupons were placed inside a holder with a well with a volume of 2.7 mL. 1.8 mL of formulation was used to cover the coupon, resulting in a thickness of formulation of ~2 mm on top of the coupon. The holder was placed on the hot plate such that the liquid temperature reached about 110° C. The samples were heated. After heating, the coupon was then removed from the well using tweezers, and was rinsed with pressurized water of 45 psi via a fan spray nozzle for 10-20 sec. Finally, the coupon was rinsed with IPA and blown dry with a stream of air. The formulation composition, heating time, and resist removal results are summarized in the Table 3.

TABLE 3

Formulation composition, heating time, and resist removal result for Example 3.

| Example | Formulation Composition (given in wt %) | Heating Time (min) | Resist Removal Results |
|---|---|---|---|
| 3 | 24.75 wt % CHP, 9.95 wt % DMAE, 54.75 wt % MEA, 9.95 wt % MIPA, 0.6 wt % $H_2O$ | 5.5 | Complete resist removal |

CHP = N-cyclohexyl-2-pyrrolidone

Examples 4-5

Formulations with varying compositions were investigated for their efficacy for removing 80 μm thick Asahi CX-8040 dry film negative photoresist from a 300 mm wafer with Pb/Sn alloy solder. Coupon-sized samples of the wafer were processed on a hot plate. Coupons were placed inside a holder with a well with a volume of 2.7 mL. 1.8 mL of formulation was used to cover the coupon, resulting in a thickness of formulation of ~2 mm on top of the coupon. The holder was placed on the hot plate such that the liquid temperature reached about 115° C. The samples were heated for different times depending on the formulation being tested. After heating, the coupon was then removed from the well using tweezers, was rinsed with pressurized water of 45 psi via a fan spray nozzle for 10-20 sec. Finally, the coupon was rinsed with IPA and blown dry with a stream of air. The formulation compositions, heating time, and resist removal results are summarized in the Table 4.

TABLE 4

Formulation compositions, heating time, and resist removal results for Examples 4-5

| Example | Formulation Composition (given in wt %) | Heating Time (min) | Resist Removal Results |
|---|---|---|---|
| 4 | 85 wt % NMP, 3 wt % MEA, 9.3 wt % propylene glycol, 2.4 wt % TMAH, 0.3 wt % $H_2O$ | 3 | Complete resist removal |
| 5 | 85 wt % NMP, 3 wt % DMAE, 9.3 wt % propylene glycol, 2.4 wt % TMAH, 0.3 wt % $H_2O$ | 3.5 | Complete resist removal |

TMAH = tetramethylammonium hydroxide

Example 6

This example concerns the removal of a 50 μm thick TOK CR4000 positive spin-on photoresist from a 300 mm wafer with Cu pillars and Sn/Ag solder caps. The composition of the stripping composition was 58.6 wt % 1-formylpiperidine, 39.4 wt % aminoethylethanolamine, 1.5 wt % $H_2O$, and 0.5 wt % of a corrosion inhibitor, where the corrosion inhibitor is a mixture of dodecanedioic acid, undecanedioic acid, and sebacic acid, which may be sold under the tradename COR-FREE M1. The wafer was processed on an EVG-301 RS single wafer photoresist stripping equipment. The wafer was placed in a chuck where ~96% of the surface area of the backside of the wafer was in contact with air, and the outer diameter of the chuck forms a liquid containment barrier around the perimeter of the wafer. The outer 3 mm radius of the backside of the wafer was in contact with the chuck. This chuck is referred to as the ring chuck. The wafer was covered with 70 mL of the stripping composition. During processing, the stripping composition remained only on the wafer and did not fill the full inner diameter of the chuck. Therefore, the thickness of the stripping composition on top of the wafer was ~1 mm. The ratio of the thickness of the stripping composition to the thickness of the resist was 20:1. The stripping composition was then heated by bringing a heater at 250° C. into close proximity (~1 mm) of the liquid surface. In this manner, the liquid was heated by convective heating. During heating, the temperature was maintained by varying the separation distance between the heater and the liquid surface to control the liquid temperature to a target temperature. In this case, the target temperature for the stripping composition was 105° C. The total time in which heat was applied to the liquid was 4 min. After 4 min, the heater was removed. The wafer was then rinsed with deionized water via fan spray nozzles simultaneously while rotating at 500 rpm for 20 sec. The wafer was next rinsed with a small volume of IPA and finally dried by spinning the wafer at 1500 rpm for 20 sec. After this process, the photoresist was completely removed from the wafer.

While applicant's disclosure has been provided with reference to specific embodiments above, it will be understood that modifications and alterations in the embodiments disclosed may be made by those practiced in the art without departing from the spirit and scope of the invention. All such modifications and alterations are intended to be covered.

What is claimed is:

1. A composition comprising:
   a) from about 20 wt. % to about 90 wt. % of a polar aprotic solvent other than dimethyl sulfoxide;
   b) from about 1 wt. % to about 70 wt. % of at least one alkanolamine having at least two carbon atoms, at least one amino substituent and at least one hydroxyl substituent, wherein the at least one amino substituent and the at least one hydroxyl substituent are attached to two different carbon atoms;
   c) less than about 3.5 wt. % of a quaternary ammonium hydroxide;
   d) optionally one or more secondary solvents, one or more corrosion inhibitors, and/or one or more surfactants; and
   e) water present in an amount no greater than about 1.5 wt. %.

2. The composition according to claim 1, wherein the polar aprotic solvent comprises dimethylformamide; dimethylacetamide; 1-formylpiperidine; dimethylsulfone; n-methylpyrrolidone; n-cyclohexyl-2-pyrrolidone; or a mixture thereof.

3. The composition of claim 1, wherein the polar aprotic solvent is present in an amount of from about 35 wt. % to about 85 wt. %.

4. The composition of claim 3, wherein the polar aprotic solvent is present in an amount of from about 55 wt. % to about 80 wt. %.

5. The composition according to claim 1, wherein the at least one alkanolamine comprises aminoethylethanolamine, dimethylaminoethanol, monoethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, 2-(2-aminoethoxy)ethanol or a mixture thereof.

6. The composition according to claim 5, wherein the at least one alkanolamine comprises dimethylaminoethanol.

7. The composition according to claim 1, wherein the at least one alkanolamine is present in an amount of less than 20 wt. %.

8. The composition according to claim 7, wherein the at least one alkanolamine is present in an amount of less than 10 wt. %.

9. The composition according to claim 8, wherein the at least one alkanolamine is present in an amount of less than 5 wt. %.

10. The composition according claim 1, wherein the quaternary ammonium hydroxide comprises tetramethylammonium hydroxide; tetramethylammonium hydroxide pentahydrate; tetrabutylammonium hydroxide; benzyltrimethylammonium hydroxide; tetrapropylammonium; dimethyldipropylammonium hydroxide; tetraethyl ammonium hydroxide; dimethyldiethyl ammonium hydroxide or a mixture thereof.

11. The composition according to claim 1 wherein the quaternary ammonium hydroxide is present in an amount less than 3 wt. %.

12. The composition according to claim 1, wherein the quaternary ammonium hydroxide is present in an amount of less than 2.5 wt. %.

13. The composition according to claim 1, wherein the quaternary ammonium hydroxide is present in an amount of less than 2.0 wt. %.

14. The composition according to claim 1, comprising one or more surfactants, one or more secondary solvents, and/or one or more metal corrosion inhibitors.

15. The composition according to claim 1, comprising one or more surfactants and one or more secondary solvents.

16. A composition comprising:
a) from about 20 wt. % to about 90 wt. % of a polar aprotic solvent;
b) a first alkanolamine present in an amount less than about 20 wt. %, the first alkanolamine having at least two carbon atoms, at least one amino substituent and at least one hydroxyl substituent, wherein the at least one amino substituent and the at least one hydroxyl substituent are attached to two different carbon atoms;
c) from about 15 wt. % to about 60 wt. % of a second alkanolamine having at least two carbon atoms, at least one amino substituent and at least one hydroxyl substituent, wherein the at least one amino substituent and the at least one hydroxyl substituent are attached to two different carbon atoms;
d) optionally one or more secondary solvents, one or more corrosion inhibitors, and/or one or more surfactants; and
e) a balance in water.

17. The composition according to claim 16, wherein the polar aprotic solvent comprises dimethyl sulfoxide; dimethylformamide; dimethylacetamide; 1-formylpiperidine; dimethylsulfone; n-methylpyrrolidone; n-cyclohexyl-2-pyrrolidone or a mixture thereof.

18. The composition according to claim 16, wherein the polar aprotic solvent comprises dimethyl sulfoxide.

19. The composition of claim 16, wherein the polar aprotic solvent is present in an amount of from about 35 wt. % to about 85 wt. %.

20. The composition of claim 19, wherein the polar aprotic solvent is present in an amount of from about 55 wt. % to about 80 wt. %.

21. The composition according to claim 16, wherein the first alkanolamine and the second alkanolamine each independently comprise aminoethylethanolamine, dimethylaminoethanol, monoethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-01, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, 2-(2-aminoethoxy)ethanol or a mixture thereof.

22. The composition according to claim 16, comprising one or more surfactants, one or more secondary solvents, and/or one or more metal corrosion inhibitors.

23. The composition according to claim 16, wherein said polar aprotic solvent is present in an amount effective for removing a photoresist or post plasma processed photoresist residue from a substrate.

24. The composition according to claim 1, comprising one or more secondary solvents, said one or more secondary solvents comprising propylene glycol.

25. The composition according to claim 16, comprising one or more secondary solvents, said one or more secondary solvents comprising propylene glycol.

26. The composition according to claim 1, wherein said composition comprises a secondary solvent, said secondary solvent comprising at least one of ethylene glycol, diethylene glycol, propylene glycol, dipropyleneglycol, isopropylene glycol, diisopropylene glycol, butylene glycol, dibutylene glycol, ethylene glycol monomethyl ether, ethylene glycol monoethyl ether, ethylene glycol monopropylether, ethylene glycol monobutyl ether, ethylene glycol dimethyl ether, ethylene glycol diethyl ether, ethylene glycol dipropyl ether, ethylene glycol dibutyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol diethyl ether, triethylene glycol monomethyl ether, triethylene glycol dimethyl ether, polyethylene glycol monomethyl ether, diethylene glycol methyl ethyl ether, triethylene glycol, ethylene glycol monomethyl ether acetate, ethylene glycol monoethyl acetate, propylene glycol monomethyl ether, propylene glycol dimethyl ether, propylene glycol monobutyl ether, dipropyelene glycol monomethyl ether, dipropylene glycol monopropyl ether, dipropylene glycol monoisopropyl ether, dipropylene glycol monobutyl ether, dipropylene glycol dimethyl ether, dipropylene glycol dipropyl ether, dipropylene glycol diisopropyl ether, tripropylene glycol and tripropylene glycol monomethyl ether, 1-methoxy-2-butanol, 2-methoxy-1-butanol, 2-methoxy-2-methyl-2-butanol, dioxane, trioxane, 1,1-dimethoxyethane, tetrahydrofuran, or crown ethers.

27. A composition comprising:
  from about 20 wt. % to about 90 wt. % of a polar aprotic solvent;
  a first alkanolamine present in an amount less than about 20 wt. %;
  a second alkanolamine present in an amount of at least about 40 wt. %;
  optionally one or more secondary solvents, one or more corrosion inhibitors, and/or one or more surfactants; and
  water present in an amount less than about 5 wt. %.

28. The composition according to claim 27, wherein the polar aprotic solvent is present in an amount of at least about 20 wt. % to no greater than about 40 wt. %.

* * * * *